US008632702B2

(12) United States Patent
Hieslmair et al.

(10) Patent No.: US 8,632,702 B2
(45) Date of Patent: Jan. 21, 2014

(54) SILICON/GERMANIUM PARTICLE INKS, DOPED PARTICLES, PRINTING AND PROCESSES FOR SEMICONDUCTOR APPLICATIONS

(75) Inventors: Henry Hieslmair, San Francisco, CA (US); Vladimir K. Dioumaev, Mountain View, CA (US); Shivkumar Chiruvolu, San Jose, CA (US); Hui Du, Sunnyvale, CA (US)

(73) Assignee: NanoGram Corporation, Milpitas, CA (US)

( * ) Notice: Subject to any disclaimer, the term of this patent is extended or adjusted under 35 U.S.C. 154(b) by 1218 days.

(21) Appl. No.: 12/006,453

(22) Filed: Jan. 2, 2008

(65) Prior Publication Data

US 2008/0160265 A1 Jul. 3, 2008

Related U.S. Application Data

(60) Provisional application No. 60/878,239, filed on Jan. 3, 2007.

(51) Int. Cl.
*H01B 1/24* (2006.01)
(52) U.S. Cl.
USPC ........ 252/521.3; 252/500; 977/773; 977/774; 977/775; 977/777; 977/784
(58) Field of Classification Search
USPC .......... 977/773, 774, 775, 777, 784; 252/500, 252/521.3
See application file for complete search history.

(56) References Cited

U.S. PATENT DOCUMENTS

| | | | |
|---|---|---|---|
| 4,330,358 A | 5/1982 | Grabmaier et al. |
| 4,390,743 A | 6/1983 | Dahlberg |
| 4,786,477 A | 11/1988 | Yoon et al. |
| 4,947,219 A | 8/1990 | Boehm |
| 5,132,248 A | 7/1992 | Drummond et al. |
| 5,262,357 A | 11/1993 | Alivisatos et al. |
| 5,374,413 A | 12/1994 | Kim et al. |
| 5,429,708 A | 7/1995 | Linford et al. |
| 5,489,449 A | 2/1996 | Umeya et al. |
| 5,491,114 A | 2/1996 | Goldstein |
| 5,559,057 A | 9/1996 | Goldstein |
| 5,576,248 A | 11/1996 | Goldstein |
| 5,695,617 A | 12/1997 | Graiver et al. |
| 5,850,064 A | 12/1998 | Goldstein |
| 5,866,471 A | 2/1999 | Beppu et al. |
| 6,007,869 A | 12/1999 | Schreieder et al. |
| 6,086,945 A | 7/2000 | Kamata et al. |
| 6,100,464 A | 8/2000 | Priesemuth |
| 6,268,041 B1 | 7/2001 | Goldstein |
| 6,281,427 B1 | 8/2001 | Mitsuhiro et al. |
| 6,287,925 B1 | 9/2001 | Yu |
| 6,348,295 B1 | 2/2002 | Griffith et al. |
| 6,403,382 B1 | 6/2002 | Zhu et al. |
| 6,416,721 B1 | 7/2002 | Sanjurjo et al. |
| 6,531,191 B1 | 3/2003 | Notenboom |
| 6,552,405 B2 | 4/2003 | Sugawara et al. |
| 6,585,947 B1 | 7/2003 | Nayfeh et al. |
| 6,586,785 B2 | 7/2003 | Flagan et al. |
| 6,599,631 B2 | 7/2003 | Kambe et al. |
| 6,712,999 B2 | 3/2004 | Haering et al. |
| 6,794,265 B2 | 9/2004 | Lee et al. |
| 6,846,565 B2 | 1/2005 | Korgel et al. |
| 6,849,334 B2 | 2/2005 | Horne et al. |
| 6,878,184 B1 | 4/2005 | Rockenberger et al. |
| 6,881,490 B2 | 4/2005 | Kambe et al. |
| 6,911,385 B1 | 6/2005 | Haubrich et al. |
| 6,918,946 B2 | 7/2005 | Korgel et al. |
| 6,998,288 B1 | 2/2006 | Smith et al. |
| 7,001,578 B2 | 2/2006 | Nayfeh et al. |
| 7,029,632 B1 | 4/2006 | Weidhaus et al. |
| 7,038,655 B2 | 5/2006 | Herb et al. |
| 7,045,851 B2 | 5/2006 | Black et al. |
| 7,057,206 B2 | 6/2006 | Halik et al. |
| 7,067,069 B2 | 6/2006 | Shiho et al. |
| 7,067,337 B2 | 6/2006 | Yudasaka et al. |
| 7,078,276 B1 | 7/2006 | Zurcher et al. |
| 7,135,350 B1 | 11/2006 | Smith et al. |

(Continued)

FOREIGN PATENT DOCUMENTS

| | | |
|---|---|---|
| JP | 05-254883 | 10/1993 |
| JP | 05-261267 | 10/1993 |

(Continued)

OTHER PUBLICATIONS

Cannon et al., "Sinterable Ceramic Powders from Laser-Driven Reaction: II, Powder Characteristics and Process Variables," J. Am. Ceramic Society 65(7): 330-335 (1982).

Cannon et al., "Sinterable Ceramic Powders from Laser-Driven Reaction: I, Process Description and Modeling," J. Am. Ceramic Society 65(7):324-329 (1982).

Goldstein et al., "Observation of Melting in 30 Å Diameter CdS Nanocrystals", Mat. Res. Sco. Symp. Proc., 206:271-274 (1991).

(Continued)

*Primary Examiner* — Mark Kopec
*Assistant Examiner* — Haidung Nguyen
(74) *Attorney, Agent, or Firm* — Dardi & Herbert, PLLC; Peter S. Dardi; Nikhil Patel

(57) ABSTRACT

Highly uniform silicon/germanium nanoparticles can be formed into stable dispersions with a desirable small secondary particle size. The silicon/germanium particles can be surface modified to form the dispersions. The silicon/germanium nanoparticles can be doped to change the particle properties. The dispersions can be printed as an ink for appropriate applications. The dispersions can be used to form selectively doped deposits of semiconductor materials such as for the formation of photovoltaic cells or for the formation of printed electronic circuits.

20 Claims, 7 Drawing Sheets

(56) References Cited

U.S. PATENT DOCUMENTS

| | | | |
|---|---|---|---|
| 7,173,180 | B2 | 2/2007 | Shiho et al. |
| 7,229,859 | B2 | 6/2007 | Yudasaka et al. |
| 7,267,721 | B2 | 9/2007 | Kauzlarich et al. |
| 7,384,680 | B2 | 6/2008 | Bi et al. |
| 7,473,443 | B2 | 1/2009 | Matsuki et al. |
| 7,521,340 | B2 | 4/2009 | Lemmi et al. |
| 7,575,784 | B1 | 8/2009 | Bi et al. |
| 7,615,393 | B1 | 11/2009 | Shah et al. |
| 7,852,435 | B2 | 12/2010 | Fujisawa et al. |
| 2002/0074547 | A1 | 6/2002 | Yudasaka et al. |
| 2003/0031438 | A1* | 2/2003 | Kambe et al. .......... 385/122 |
| 2003/0045632 | A1 | 3/2003 | Shiho et al. |
| 2005/0008880 | A1 | 1/2005 | Kunze et al. |
| 2005/0145163 | A1 | 7/2005 | Matsuki et al. |
| 2005/0170192 | A1 | 8/2005 | Kambe et al. |
| 2006/0094189 | A1 | 5/2006 | Zurcher et al. |
| 2006/0137567 | A1 | 6/2006 | Yadav |
| 2006/0157677 | A1 | 7/2006 | Kunze et al. |
| 2006/0237719 | A1 | 10/2006 | Colfer et al. |
| 2007/0003694 | A1 | 1/2007 | Chiruvolu et al. |
| 2007/0094757 | A1 | 4/2007 | Pridohl et al. |
| 2008/0083926 | A1 | 4/2008 | Ostergard |
| 2008/0138966 | A1 | 6/2008 | Rogojina et al. |
| 2008/0152938 | A1 | 6/2008 | Kelman et al. |
| 2008/0171425 | A1 | 7/2008 | Poplavskyy et al. |
| 2008/0191193 | A1 | 8/2008 | Li et al. |
| 2008/0202576 | A1 | 8/2008 | Hieslmair |
| 2008/0220175 | A1 | 9/2008 | Mangolini et al. |
| 2008/0305619 | A1 | 12/2008 | Lemmi et al. |
| 2009/0026421 | A1 | 1/2009 | Li et al. |
| 2009/0263977 | A1 | 10/2009 | Rogojina et al. |
| 2009/0269913 | A1 | 10/2009 | Terry et al. |

FOREIGN PATENT DOCUMENTS

| | | |
|---|---|---|
| JP | 06-091162 | 4/1994 |
| JP | 06-142496 | 5/1994 |
| JP | 07-008792 | 1/1995 |
| JP | 10-45409 A | 2/1998 |
| JP | 2000-219901 | 8/2000 |
| JP | 2000-282222 | 10/2000 |
| WO | 2005/013337 A2 | 2/2005 |
| WO | 2005049492 A1 | 6/2005 |
| WO | 2006009881 A1 | 1/2006 |
| WO | 2007023362 A1 | 3/2007 |
| WO | 2007072162 A1 | 6/2007 |
| WO | 2007117265 A2 | 10/2007 |
| WO | 2008030966 A1 | 3/2008 |
| WO | 2008039757 A2 | 4/2008 |
| WO | 2008061131 A2 | 5/2008 |
| WO | 2008073763 A2 | 6/2008 |
| WO | 2008091393 A2 | 7/2008 |
| WO | 2008118865 A2 | 10/2008 |
| WO | 2008137738 A2 | 11/2008 |
| WO | 2008143716 A2 | 11/2008 |
| WO | 2008152272 A2 | 12/2008 |
| WO | 2009032359 A2 | 3/2009 |
| WO | 2009114026 A1 | 9/2009 |
| WO | 2009117007 A2 | 9/2009 |

OTHER PUBLICATIONS

Thomas, "The Determination of Log Normal Particle Size Distributions by Dynamic Light Scattering", Journal of Colloid and Interface Science, 117(1):187-192 (May 1987).

European Search Report (EP08712916.9) dated Aug. 5, 2011 (13 pages).

* cited by examiner

|  | Diam. (nm) | % Intensity | Width (nm) |
|---|---|---|---|
| Z-Average (d.nm): 72.0 | Peak 1: 108 | 90.3 | 44.7 |
| Pdl: 0.282 | Peak 2: 17.9 | 9.7 | 3.73 |
| Intercept: 0.890 | Peak 3: 0.00 | 0.0 | 0.00 |

|  | | Diam. (nm) | % Intensity | Width (nm) |
|---|---|---|---|---|
| Z-Average (d.nm): 72.0 | Peak 1: | 108 | 90.3 | 44.7 |
| Pdl: 0.282 | Peak 2: | 17.9 | 9.7 | 3.73 |
| Intercept: 0.890 | Peak 3: | 0.00 | 0.0 | 0.00 |

SILICON/GERMANIUM PARTICLE INKS, DOPED PARTICLES, PRINTING AND PROCESSES FOR SEMICONDUCTOR APPLICATIONS

CROSS REFERENCE TO RELATED APPLICATIONS

This application claims priority to U.S. provisional patent application Ser. No. 60/878,239 filed on Jan. 3, 2007 to Hieslmair et al., entitled "Doped Dispersions and Processes for Doping Semiconductor Substrates," incorporated herein by reference.

FIELD OF THE INVENTION

The invention relates to dispersions/inks of silicon/germanium particles, such as doped silicon particles. The invention further relates to inks that are suitable for inkjet printing. Additionally, the invention relates to the use of doped silicon/germanium particles for the formation of doped structure and/or domains along semiconductor substrates, such as through the sintering of silicon/germanium particle deposits formed through deposition onto a semiconductor surface.

BACKGROUND OF THE INVENTION

The formation of semiconductor devices generally involves the formation of doped regions in which the dopants alter the electrical conduction properties or other desired properties. Through the selected doping process different domains can be formed in the material that provide functionalities for particular semiconductor devices. For example, some dopants provide excess electrons that can populate the conduction bands, and the resulting materials are referred to as n-type semiconductors. Other dopants provide holes and are used to form p-type semiconductors. Additional dopants can provide other functionalities. Through appropriate doping, a wide range of devices can be formed, such as transistors, diodes and the like.

With increasing costs and undesirable environmental effects from the use of fossil fuels and other non-renewable energy sources, there are growing demands for alternative forms of energy. Various technologies are available for the formation of photovoltaic cells, i.e., solar cells. A majority of commercial photovoltaic cells are based on silicon. Increased commercialization of alternative energy sources relies on increasing cost effectiveness through lower costs per energy unit. Thus, for a photovoltaic cell, the objective would be to increase energy conversion efficiency for a given light fluence and/or to lower the cost of producing a cell.

SUMMARY OF THE INVENTION

In a first aspect, the invention pertains to a dispersion of silicon/germanium nanoparticles comprising a liquid and at least about 0.1 weight percent silicon/germanium nanoparticles. The doped silicon/germanium nanoparticle can have an average primary particle size of no more than about 100 nm and a volume-average secondary particle size of no more than about three times that average primary particle size.

In a further aspect, the invention pertains to a method for surface modifying silicon/germanium nanoparticles in which the method comprises blending the surface modifying composition into a dispersion of the silicon/germanium nanoparticles in a dispersing liquid wherein the silicon/germanium nanoparticles have a volume-average secondary particle size of no more than about a factor of 5 times the average primary particle size, wherein the silicon/germanium nanoparticles have an average primary particle size of no more than about 100 nm. In some embodiments, the surface modifying composition chemically bonds with the silicon/germanium particle surfaces to form surface modified nanoparticles with a surface modification moiety chemically bonded to the nanoparticle surfaces.

In another aspect, the invention relates to a method for depositing silicon/germanium nanoparticles. The method comprises printing an ink comprising a dispersing liquid and silicon/germanium particles in which the silicon/germanium nanoparticle have an average particle size of no more than about 75 nm and a volume-average secondary particle of no more than about 150 nm. The ink can have a viscosity of no more than about 400 mPa·s at room temperature.

In other aspects, the invention relates to a printed substrate comprising a substrate surface having a selected pattern covering no more than about 90 percent of the surface area in which the pattern comprises silicon/germanium nanoparticles, the nanoparticles having an average primary particle size of no more than about 100 nm. In some embodiments, the silicon/germanium nanoparticles have a distribution of primary particle sizes such that at least about 95 percent of the primary particles have a diameter greater than about 40 percent of the average diameter and less than about 160 percent of the average diameter.

DETAILED DESCRIPTION OF THE INVENTION

Figure 1:
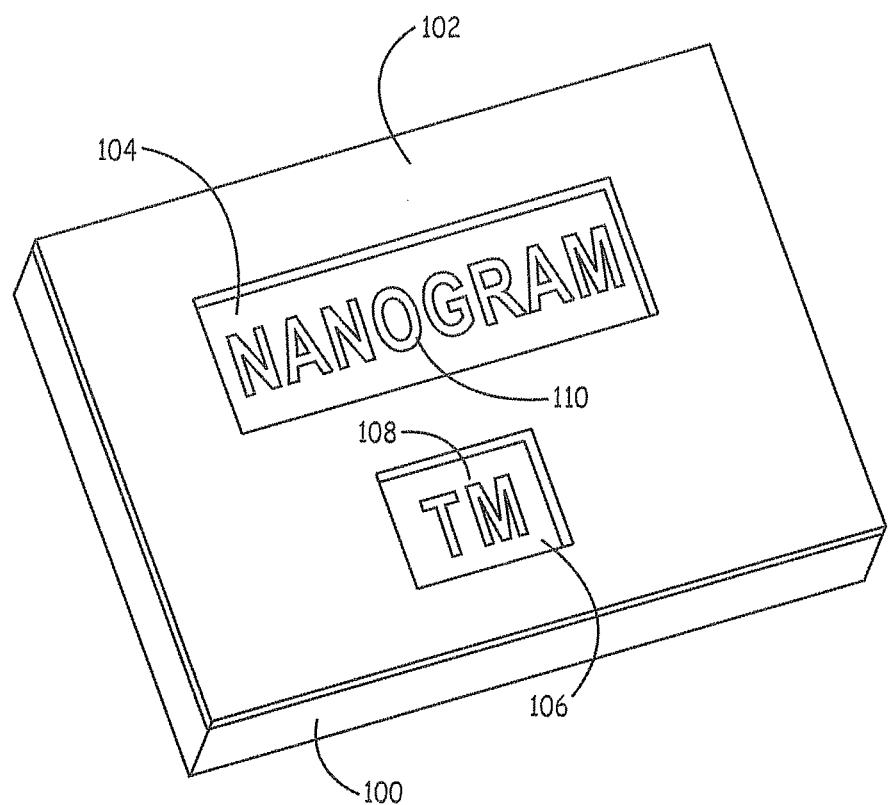
FIG. 1 is a top perspective view of a printed substrate.

Versatile processes for the delivery of silicon and/or germanium nanoparticles can be based upon the ability to form high quality dispersions of silicon nanoparticles along with the ability to produce silicon nanoparticles with desirable properties. In some embodiments, the silicon particles have selected dopants to provide desired properties for the particles. As described herein, the dispersions of the silicon particles generally have highly uniform silicon particles that can be dispersed well such that the resulting dispersions have a small secondary particle size with high uniformity. Flow-based methods are described that can effectively form silicon nanoparticles with high particle uniformity as well as a selected dopant concentration. Since the dispersions can be formed with appropriate properties, the dispersions can be used to formulate inks suitable for inkjet printing, which provides for efficient and precise deposition of the inks. In embodiments relating to doped silicon particles, the dispersions and inks can be used to place deposits of doped silicon at selected locations along a semiconductor substrate. The doped silicon particles can be used to form doped layers or domains along the semiconductor materials.

Silicon is an important material for a range of applications. In particular, silicon is a widely used semiconductor material for the formation of electrical circuits. Also, silicon can be selectively doped to influence the electrical properties of the silicon. Germanium can be used similarly as semiconductors from electrical circuit formation. For some applications, mixtures or blends of silicon and germanium may be useful. To simplify the discussion in the detailed description of the invention, the term silicon is used to refer to silicon, germanium, combinations, e.g., alloys, thereof and mixtures thereof, unless otherwise stated or otherwise clearly limited in context, such as with respect to the description of chemical precursors. With respect to the claims, silicon shall refer only to silicon, and silicon/germanium shall refer to silicon, germanium, combinations/alloys thereof and mixtures thereof.

Dispersions of particular interest comprise a dispersing liquid and silicon particles dispersed within the liquid along with optional additives. The dispersion can be stable with respect to avoidance of settling over a reasonable period of time, generally at least an hour, without further mixing. A dispersion can be used as an ink, i.e., the dispersion can be printed. The properties of the ink can be adjusted based on the particular printing method. For example, in some embodiments, the viscosity of the ink is adjusted for the particular use, such as inkjet printing, and particle concentrations and additives provide some parameters to adjust the viscosity. The availability to form stable dispersions with small secondary particle sizes provides the ability to form certain inks. Other additives can be used to formulate a range of inks with appropriate properties.

The ability to form good dispersion is related to the ability to synthesize silicon particles, including doped silicon particles, with appropriate particle properties relating to the particle size, uniformity and surface chemistry. Flow based synthesis methods have been discovered to be very versatile with respect to synthesizing desired silicon particles with or without dopants. In flow based methods, such as laser pyrolysis and flame pyrolysis, the product particles are collected as a powder. These flow-based approaches are particularly versatile with respect to forming doped silicon particles.

Furthermore, it is desirable for the silicon particles to be uniform with respect to particle size and other properties. Specifically, it is desirable for the particles to have a uniform primary particle size and for the primary particles to be substantially unfused. Then, the particles generally can be dispersed to yield a smaller more uniform secondary particle size in the dispersion. Secondary particle size refers to measurements of particle size within a dispersion. The formation of a good dispersion with a small secondary particle size can be facilitated through the matching of the surface chemistry of the particles with the properties of the dispersing liquid. The surface chemistry of particles can be influenced during synthesis of the particles as well as following collection of the particles. For example, the formation of dispersions with polar solvents is facilitated if the particles have polar groups on the particle surface.

In general, desirable silicon particles for dispersions and corresponding inks are submicron. In other words, the particle collections have an average primary particle diameter of no more than about 1 micron, which is equal to 1000 nanometers (nm), and in some embodiments the average primary particle diameter is no more than about 100 nm. In some embodiments, the particles are very uniform in particle size. Also, the particle can have appropriate surface properties to form good dispersions for inks and other uses. Suitable submicron particles can be formed, for example, by vapor-based flow processes, such as flame pyrolysis or laser pyrolysis. Laser pyrolysis is a desirable approach for the formation of the particles since the resulting particle are generally highly uniform and can be well dispersed, which can involve surface modification of the particles, as described further below. In addition, laser pyrolysis is also desirable due to its flexibility with respect to product particle composition, such as a wide range of ability to introduce dopants.

As described herein, suitable approaches have been found to disperse dry nanoparticle powders, perform surface modification of the particles in a dispersion and form inks and the like for deposition. Using one or more of the processing approaches described herein, inks can be formed that can be deposited using inkjet printing and other convenient printing approaches. Thus, the advantages of vapor-based particle synthesis can be combined with desirable solution based processing approaches with highly dispersed particles to obtain desirable dispersions and inks, which can be formed with doped particles.

In some embodiments of particular interest, the particles are synthesized by laser pyrolysis in which light from an intense light source drives the reaction to form the particles. Laser pyrolysis is useful in the formation of particles that are highly uniform in composition and size. The ability to introduce a range of precursor compositions facilitates the formation of silicon particles with selected dopants, which can be introduced at relatively high concentrations.

Laser pyrolysis has been successfully used for the synthesis of a wide range of complex inorganic particles, including, for example, compositions with multiple metal/metalloid elements as well as doped materials. In the laser pyrolysis process, the dopant element(s) are introduced into the reactant stream such that the elements can be incorporated into the product particles. The dopant elements can be delivered into the reactant stream as a suitable composition. The reactant stream can comprise vapor precursor and/or aerosol precursors. For the doping of semiconductor substrates, desirable dopants include, for example, B, P, Al, Ga, As, Sb and combinations thereof.

With respect to silicon dispersions, the dispersions can have concentrations from low concentrations to about 30 weight percent. In general, the secondary particles size can be expressed as a cumulant mean, or Z-average particle size as measured with dynamic light scattering (DLS). The Z-average particle size is an intensity average based on the scattered light measurements, and the scattering intensity based particle size distribution can be converted to volume distributions that can be used to evaluate a volume-average size. Generally, the volume-average particle size is no more than about 2 microns and in some embodiments, no more than about 250 nm. Additionally, in some embodiments it is desirable for the secondary particle size distribution to be narrow.

In general, the surface chemistry of the particles influences the process of forming the dispersion. In particular, it is easier to disperse the particles to form smaller secondary particle sizes if the dispersing liquid and the particle surfaces are compatible chemically, although other parameters such as density, particle surface charge, solvent molecular structure and the like also directly influence dispersability. In some embodiments, the liquid may be selected for to be appropriate for the particular use of the dispersion, such as for a printing process. The surface properties of the particles can be correspondingly be adjusted for the dispersion. For silicon synthesized using silanes, the resulting silicon generally is partially hydrogenated, i.e., the silicon includes some small amount of hydrogen in the material. It is generally unclear if this hydrogen or a portion of the hydrogen is at the surface as Si—H bonds. However, the presence of a small amount of hydrogen does not presently seem particularly significant.

In general, the surface chemistry of the particles can be influenced by the synthesis approach, as well as subsequent handling of the particles. The surface by its nature represents a termination of the underlying solid state structure of the particle. This termination of the surface of the silicon particles can involve truncation of the silicon lattice. The termination of particular particles influences the surface chemistry of the particles. The nature of the reactants, reaction conditions, and by-products during particle synthesis influences the surface chemistry of the particles collected as a powder during flow reactions. In some embodiments, the silicon particles can become surface oxidized, for example through exposure to air. For these embodiments, the surface can have bridging oxygen atoms in Si—O—Si structures or Si—O—H groups if hydrogen is available during the oxidation process. The presence of OH bonds provide for alternative surface modification approaches.

The stability of particle dispersions can be improved at higher concentrations of particles through surface modification of the particles. In general, the surface properties of the particles influence the dispersion of the particles. The surface properties of the particles generally depend on the synthesis approach as well as the post synthesis processing. Some surface active agents, such as many surfactants, act through non-bonding interactions with the particle surfaces. In some embodiments, desirable properties are obtained through the use of surface modification agents that chemically bond to the particle surface. The surface chemistry of the particles influences the selection of surface modification agents.

For surface oxidized silicon particles, suitable surface modification agents include, for example, alkoxysilanes, which chemically bond to metal oxide and metalloid oxide particles. Specifically, the alkoxysilanes bond through an Si—O—Si bond. In particular, trialkoxysilanes can form three bonds with the oxidized particle surface, which stabilizes the bonds with the particle. The fourth side group of the trialkoxysilane that does not bond with the oxidized particle surface influences the resulting properties of the surface modified particles that relate with the interaction with fluids.

In general, silicon can be oxidized upon exposure to air. Therefore, the oxide coated particles can form the basis for further modification. The oxide coating can be reacted with $NH_4^+F$ or HF to replace Si—O—H bonds with Si—H bonds that can be further reacted. In particular, the hydrogenated surfaces with Si—H groups provide for the organic functionalization of the silicon surface. Functionalization of silicon surfaces is described further in U.S. Pat. No. 5,429,708 to Linford et al., entitled "Molecular Layers Covalently Bonded to Silicon Surfaces," incorporated herein by reference.

For silicon particles without an oxidized surface, the surface can be functionalized, for example, with halogens, such as $Cl_2$ to form Si—Cl bonds. Organic compounds with nucleophilic groups, such as —$NH_2$, —OH, =NH, —SH, —SeH, TeH and —$PH_2$, can be reacted with the Si—Cl groups to form bonds with the silicon atom through a nucleophilic substitution. These reactions are described further in U.S. Pat. No. 6,403,382 to Zhu et al., entitled "Attachment Chemistry for Organic Molecules to Silicon," incorporated herein by reference. These reactions should not be altered in the presence of a dopant.

When processing a dry, as-synthesized powder, it has been found that forming a good dispersion of the particles prior to surface modification involving chemical bonding facilitates the surface modification process and results in particles with a higher degree of surface modification. The dispersion of the as-synthesized particles generally comprises the selection of a solvent that is relatively compatible with the particles based on the surface chemistry of the particles. Shear, sonication or other appropriate mixing conditions can be applied to facilitate the formation of the dispersion. In general, it is desirable for the particles to be well dispersed, although the particles do not need to be stably dispersed if the particles are subsequently surface modified with a chemically bonded composition.

If the particles are dispersed prior to performing the surface modification, the surface modification agent can be added to the dispersion in a solvent that is soluble or miscible with dispersing liquid of the particle dispersion. Appropriate mixing can be applied to combine the surface modifying composition with the dispersed particles. The surface modifying compound can chemically bond with the dispersed particles to form a dispersion of surface modified particles.

The silicon inks can be deposited onto the substrate using any suitable process, such as a selected coating process, for example, spray coating, and/or printing. While various printing approaches can be effective, inkjet printing is desirable in some embodiments due to resolution and speed that can be achieved. Suitable inkjet heads are available commercially or can be constructed in simple forms using basic technology, although new designs can be used that are more suitable for a particular application.

Printing processes can effectively coat large areas very quickly and efficiently. For semiconductor applications, the use of the printing techniques described herein can eliminate one or more photolithography steps. For circuit formation, the substrate can comprise semiconductor materials, such as silicon, germanium or alloy thereof, or in other embodiments, a polymer substrate. A printing process can deposit the ink at specific locations along the substrate surface. This allows the selective placement of silicon particles with or without a dopant along the substrate, such as for circuit formation. Other patterning approaches can be used alone or combined with a printing approach, or no patterning can be used, as appropriate for a specific application.

For printed circuit applications, once a doped silicon ink is deposited at selected locations, the particles can be sintered or otherwise fused at the deposited position on the substrate to form a corresponding structure or domain. This can be done by heating the substrate in an oven to relatively high temperatures, such as 750° C. to 1250° C. to obtain a solid mass from the particles in intimate contact with the substrate surface. Nanoparticles melt or flow at lower temperatures than larger particles so that the use of nanoparticles can facilitate the process with oven based heating. These temperatures are still below the melting point of bulk silicon, so that rapid thermal annealing can be used on silicon substrates and other relatively high temperature substrates. However, improved control of the process as well as energy saving can be obtained through the application of light energy, such as from a laser or incoherent light source, to melt the particles at the deposited position along the substrate without generally heating the substrate or only heating the substrate to lower temperatures. This photonic curing process may be suitable for some lower melting substrates.

In general, the deposition approaches described herein can be applied to any appropriate electric circuit applications. Thus, the dopant approaches described herein can be used in the formation of integrated circuits and other electrical and electro-optical devices, such as microelectromechanical (MEMS) devices. In particular, these processing approaches can be effectively used in the formation of photovoltaic devices, i.e., solar cells. The processes herein are well suited for large area semiconductors such as photovoltaic panels as well as other large area applications, such as display circuits. Similarly, through the printing process the doped silicon can be used to form dopant domains to corresponding select locations on the substrate surface so that printed electronics can be formed. Printed electronics can be an effective approach for the formation of semiconductor devices with moderate resolution of electrical components at a lower cost than photolithography.

The formation of desirable solar cell elements on a thin silicon foil is described further in copending U.S. Provisional patent application 60/902,006 to Hieslmair et al. filed Feb. 16, 2007, entitled "Photovoltaic Cell Structures, Solar Panels and Corresponding Structures," incorporated herein by reference. This provisional application describes forming shallow doped regions in some embodiments. These shallow doped regions can be conveniently formed by printing the doped silicon and using heat and/or light, such as from a laser or flash lamp, to fuse the doped silicon into corresponding doped contacts, as described further below. In other embodiments, thicker junctions may be desirable.

Printed circuit applications of particular interest include, for example, display circuits in which electrical connections for display elements cover a relatively large area while involving moderate resolution to distinguish the elements. The display circuits can be formed through the printing process and subsequent processing to form the circuitry for controlling the display element.

As described herein, high quality dispersions of silicon, with or without dopants, provides the ability for effective printing of the silicon to form higher resolution structures. Due to the enhanced ability to control the properties of the inks, the silicon can be printed rapidly and with relatively high resolution, for example, using inkjet printing or other desired approach. The ability to introduce silicon with selected dopants over a wide range of compositions provides the ability to form a corresponding wide range of devices based on the silicon particles. The dopants can be selected based on the particle device to be formed and the corresponding desired electrical properties for the element. Using the printing process, silicon particles with different dopants can be selectively placed at different locations along the substrate surface.

Particle Synthesis and Properties

The desirable dispersions described herein are based in part on the ability to form highly uniform silicon nanoparticles with or without dopants. Laser pyrolysis is a particularly suitable approach for the synthesis of highly uniform silicon particles. Also, laser pyrolysis is a versatile approach for the introduction of desired dopants at a selected concentration. Also, the surface properties of the silicon particles can be influences by the laser pyrolysis process, although the surface properties can be further manipulated after synthesis to form desired dispersions. Small and uniform silicon particles can provide processing advantages with respect to forming dispersions/inks.

In some embodiments, the particles have an average diameter of no more than about one micron, and in further embodiments it is desirable to have particles with smaller particle sizes to introduce desired properties. For example, nanoparticles with a small enough average particle size are observed to melt at lower temperatures than bulk material, which can be advantageous in some contexts. Also, the small particle sizes provide for the formation of inks with desirable properties, which can be particularly advantageous for inkjet printing since larger particles may clog some inkjet heads. Generally, the dopants and the dopant concentration are selected based on the desired electrical properties of the subsequently fused material.

Suitable submicron and nano-scale particles can be formed, for example, by laser pyrolysis, flame synthesis or combustion approaches. While laser pyrolysis is a desirable approach for particle production, submicron particles can be produced using a flame production apparatus such as the apparatus described in U.S. Pat. No. 5,447,708 to Helble et al., entitled "Apparatus for Producing Nanoscale Ceramic Particles," incorporated herein by reference. Furthermore, submicron particles can be produced with a thermal reaction chamber such as the apparatus described in U.S. Pat. No. 4,842,832 to Inoue et al., "Ultrafine Spherical Particles of Metal Oxide and a Method for the Production Thereof," incorporated herein by reference.

In particular, laser pyrolysis is useful in the formation of particles that are highly uniform in composition, crystallinity, when appropriate, and size. Laser pyrolysis involves light from an intense light source that drives the reaction to form the particles. Due to the versatility of laser pyrolysis as an excellent approach for efficiently producing a wide range of nanoscale particles with a selected composition and a narrow distribution of average particle diameters, laser pyrolysis can be used to form doped silicon particles with a wide range of selected dopants or combinations of dopants. For convenience, light-based pyrolysis is referred to as laser pyrolysis since this terminology reflects the convenience of lasers as a radiation source and is a conventional term in the art. Laser pyrolysis approaches discussed herein incorporate a reactant flow that can involve gases, vapors, aerosols or combinations thereof to introduce desired elements into the flow stream. The versatility of generating a reactant stream with gases, vapor and/or aerosol precursors provides for the generation of particles with a wide range of potential compositions.

A collection of submicron/nanoscale particles may have an average diameter for the primary particles of less than about 500 nm, in some embodiments from about 2 nm to about 100 nm, alternatively from about 2 nm to about 75 nm, or from about 2 nm to about 50 nm. A person of ordinary skill in the art will recognize that other ranges within these specific ranges are covered by the disclosure herein. Primary particle diameters are evaluated by transmission electron microscopy.

As used herein, the term "particles" refer to physical particles, which are unfused, so that any fused primary particles are considered as an aggregate, i.e. a physical particle. For particles formed by laser pyrolysis, the particles can be generally effectively the same as the primary particles, i.e., the primary structural element within the material. Thus, the ranges of average primary particle sizes above can also be used with respect to the particle sizes. If there is hard fusing of some primary particles, these hard fused primary particles form correspondingly larger physical particles. The primary particles can have a roughly spherical gross appearance, or they can have rod shapes, plate shapes or other non-spherical shapes. Upon closer examination, crystalline particles may have facets corresponding to the underlying crystal lattice. Amorphous particles generally have a spherical aspect. Diameter measurements on particles with asymmetries are based on an average of length measurements along the principle axes of the particle.

Because of their small size, the particles tend to form loose agglomerates due to van der Waals and other electromagnetic forces between nearby particles. Even though the particles may form loose agglomerates, the nanometer scale of the particles is clearly observable in transmission electron micrographs of the particles. The particles generally have a surface area corresponding to particles on a nanometer scale as observed in the micrographs. Furthermore, the particles can manifest unique properties due to their small size and large surface area per weight of material. These loose agglomerates can be dispersed in a liquid to a significant degree, and in some embodiments approximately completely to form dispersed primary particles.

The particles can have a high degree of uniformity in size. Laser pyrolysis generally results in particles having a very narrow range of particle diameters. Furthermore, heat processing under suitably mild conditions generally does not significantly alter the very narrow range of particle diameters. With aerosol delivery of reactants for laser pyrolysis, the distribution of particle diameters is particularly sensitive to the reaction conditions. Nevertheless, if the reaction conditions are properly controlled, a very narrow distribution of particle diameters can be obtained with an aerosol delivery system. As determined from examination of transmission electron micrographs, the particles generally have a distribution in sizes such that at least about 95 percent, and in some embodiments 99 percent, of the particles have a diameter greater than about 35 percent of the average diameter and less than about 280 percent of the average diameter. In additional embodiments, the particles generally have a distribution in sizes such that at least about 95 percent, and in some embodiments 99 percent, of the particles have a diameter greater than about 40 percent of the average diameter and less than about 250 percent of the average diameter. In further embodiments, the particles have a distribution of diameters such that at least about 95 percent, and in some embodiments 99 percent, of the particles have a diameter greater than about 60 percent of the average diameter and less than about 200 percent of the average diameter. A person of ordinary skill in the art will recognize that other ranges of uniformity within these specific ranges are contemplated and are within the present disclosure.

Furthermore, in some embodiments essentially no particles have an average diameter greater than about 5 times the average diameter, in other embodiments about 4 times the average diameter, in further embodiments 3 times the average diameter, and in additional embodiments 2 times the average diameter. In other words, the particle size distribution effectively does not have a tail indicative of a small number of particles with significantly larger sizes. This is a result of the small reaction region to form the inorganic particles and corresponding rapid quench of the inorganic particles. An effective cut off in the tail of the size distribution indicates that there are less than about 1 particle in $10^6$ has a diameter greater than a specified cut off value above the average diameter. High particle uniformity can be exploited in a variety of applications.

In addition, the submicron particles may have a very high purity level. Furthermore, crystalline nanoparticles, such as those produced by laser pyrolysis, can have a high degree of crystallinity. Similarly, the crystalline nanoparticles produced by laser pyrolysis can be subsequently heat processed to improve and/or modify the degree of crystallinity and/or the particular crystal structure. Impurities on the surface of the particles may be removed by heating the particles to achieve not only high crystalline purity but high purity overall.

The size of the dispersed particles can be referred to as the secondary particle size. The primary particle size, of course, is the lower limit of the secondary particle size for a particular collection of particles, so that the average secondary particle size can be approximately the average primary particle size if the primary particles are substantially unfused and if the particles are effectively completely dispersed in the liquid.

The secondary or agglomerated particle size may depend on the subsequent processing of the particles following their initial formation and the composition and structure of the particles. In particular, the particle surface chemistry, properties of the dispersant, the application of disruptive forces, such as shear or sonic forces, and the like can influence the efficiency of fully dispersing the particles. Ranges of values of average secondary particle sizes are presented below with respect to the description of dispersions. Secondary particles sizes within a liquid dispersion can be measured by established approaches, such as dynamic light scattering. Suitable particle size analyzers include, for example, a Microtrac UPA instrument from Honeywell based on dynamic light scattering, a Horiba Particle Size Analyzer from Horiba, Japan and ZetaSizer Series of instruments from Malvern based on Photon Correlation Spectroscopy. The principles of dynamic light scattering for particle size measurements in liquids are well established.

A basic feature of successful application of laser pyrolysis for the production of desirable silicon particles is the generation of a reactant stream containing one or more silicon precursor compounds and, in some embodiments, a radiation absorber and/or a secondary reactant. The secondary reactant can be a source of atoms for the product particles and/or can be an oxidizing or reducing agent to drive a desired product formation. A secondary reactant may not be used if the precursor decomposes to the desired product under intense light radiation, which can be the situation for silicon particles. Similarly, a separate radiation absorber may not be used if the silicon precursor absorbs the appropriate light radiation to drive the reaction. Dopant precursors can be introduced into the reactant flow for incorporation into the silicon particles.

The reaction of the reactant stream is driven by an intense radiation beam, such as a light beam, e.g., a laser beam. In some embodiments, $CO_2$ lasers can be effectively used. As the reactant stream leaves the radiation beam, the inorganic particles are rapidly quenched with particles in present in the resulting product particle stream, which is a continuation of the reactant stream. The concept of a stream has its conventional meaning of a flow originating from one location and ending at another location with movement of mass between the two points, as distinguished from movement in a mixing configuration.

A laser pyrolysis apparatus suitable for the production of commercial quantities of particles by laser pyrolysis has been developed using a reactant inlet that is significantly elongated in a direction along the path of the laser beam. This high capacity laser pyrolysis apparatus, e.g., 1 kilogram or more per hour, is described in U.S. Pat. No. 5,958,348, entitled "Efficient Production Of Particles By Chemical Reaction," incorporated herein by reference. Approaches for the delivery of aerosol precursors for commercial production of particles by laser pyrolysis is described in copending and commonly assigned U.S. Pat. No. 6,193,936 to Gardner et al., entitled "Reactant Delivery Apparatus," incorporated herein by reference. With respect to combined vapor and aerosol delivery approaches, a silicon precursor can be delivered as a vapor, while one or more dopant precursors is delivered as an aerosol. However, for many desirable dopants, suitable dopant precursors can be delivered as a vapor.

In general, nanoparticles produced by laser pyrolysis can be subjected to additional processing to alter the nature of the particles, such as the composition and/or the crystallinity. For example, the nanoparticles can be subjected to heat processing in a gas atmosphere prior to use. Under suitably mild conditions, heat processing is effective to modify the characteristics of the particles, such as removal of carbon contaminants, without destroying the nanoscale size or the narrow particle size distribution of the initial particles. For example, heat processing of submicron vanadium oxide particles is described in U.S. Pat. No. 5,989,514 to Bi et al., entitled "Processing Of Vanadium Oxide Particles With Heat," incorporated herein by reference.

A wide range of simple and complex submicron and/or nanoscale particles have been produced by laser pyrolysis with or without additional heat processing. Specifically, the inorganic particles can include, for example, elemental metal or elemental metalloid, i.e. un-ionized elements such as silver or silicon, metal/metalloid oxides, metal/metalloid nitrides, metal/metalloid carbides, metal/metalloid sulfides or combinations thereof. In addition, uniformity of these high quality materials can be substantial. These particles generally can have a very narrow particle size distribution. In particular, laser pyrolysis for the formation of silicon particles is described in Cannon et al., "Sinterable Ceramic Powders from Laser-Driven Reaction: I, Process Description and Modeling," J. Am. Ceramic Society 65 (7), 324 (1982), and Cannon et al., "Sinterable Ceramic Powders from Laser-Driven Reaction: II, Powder Characteristics and Process Variables," J. Am. Ceramic Society 65 (7), 330 (1982), both of which are incorporated by reference. Laser pyrolysis methods and uniform silica particles formed by laser pyrolysis are described further in U.S. Pat. No. 6,471,903 to Kambe et al., entitled "Silicon Oxide Particles," and U.S. Pat. No. 6,726,990 to Kumar et al., entitled "Silicon Oxide Particles," both of which are incorporated herein by reference. Doped silica particles formed using laser pyrolysis process are described in U.S. Pat. No. 6,849,334 to Horne et al., entitled "Optical Materials and Optical Devices," incorporated herein by reference. The production of a range of particles by laser pyrolysis is described further in published U.S. Patent Application 2003/203205A to Bi et al., entitled "Nanoparticle Production and Corresponding Structures," incorporated herein by reference.

Submicron and nanoscale particles can be produced with selected dopants using laser pyrolysis and other flowing reactor systems. Dopants can be introduced at desired concentrations by varying the composition of the reactant stream. A dopant element or a combination of dopant elements are introduced into the silicon host material by appropriately selecting the composition in the reactant stream and the processing conditions. Thus, submicron particles incorporating selected dopants, including, for example, complex blends of dopant compositions, can be formed. Generally, the conditions in the reactor should be sufficiently reducing to produce the elemental silicon or alloys for the product nanoparticles. The doped particles can be either amorphous solid state blends with the dopant composition dissolved in the host material. However, generally the silicon particles are crystalline, and the dopant can be an intercalation or alloying element. In some embodiments, one or more dopants can be introduced in concentrations in the particles from about $1.0 \times 10^{-7}$ to about 15 atomic percent relative to the silicon atoms, in further embodiments from about $1.0 \times 10^{-5}$ to about 5.0 atomic percent and in further embodiments from about $1 \times 10^{-4}$ to about 1.0 atomic percent relative to the silicon atoms. A person of ordinary skill in the art will recognize that additional ranges within the explicit dopant level ranges are contemplated and are within the present disclosure.

Dopants can be introduced to vary properties of the resulting particles. For example, dopants can be introduced to change the electrical properties of the particles. In particular, As, Sb and/or P dopants can be introduced into the silicon particles to form n-type semiconducting materials in which the dopant provide excess electrons to populate the conduction bands, and B, Al, Ga and/or In can be introduced to form p-type semiconducting materials in which the dopants supply holes.

In general, any reasonable element can be introduced as a dopant to achieve desired properties. Suitable silicon precursors for elemental silicon particle formation include, for example, silane ($SiH_4$), disilane ($Si_2H_6$), trisilane ($Si_3H_8$), silicon tetrachloride ($SiCl_4$), trichlorosilane ($SiCl_3H$), and $SiCl_2H_2$. Silane, $SiH_4$, is a convenient precursor for laser pyrolysis since it absorbs infrared light from a $CO_2$ laser and decomposes to form crystalline silicon particles upon decomposition. The higher order silanes similarly decompose to form elemental silicon, i.e. $Si^0$, silicon in its elemental state. Thus, with silane as a precursor, a secondary reactant source may not be used, and a separate infrared absorber is not needed. Corresponding germanes ($GeH_4$ and $Ge_2H_6$) can be used as precursors. An inert gas can be used to moderate the reaction. Suitable inert gases include for example, Ar, He $N_2$ or mixtures thereof.

Suitable precursors for B, Al, Ga, P, As, Sb and other dopants are described explicitly in the '334 patent. Suitable precursors for aerosol delivery of gallium include, for example, gallium nitrate ($Ga(NO_3)_3$). Arsenic precursors include, for example, $AsCl_3$, which is suitable for vapor delivery, and $As_2O_5$, which is suitable for aerosol precursor delivery in aqueous or alcohol solutions. Suitable boron precursors comprise, for example, diborane ($B_2H_6$), $BH_3$, and the like, and suitable combinations of any two or more thereof. Suitable aluminum precursors include, for example, aluminum hydride ($AlH_3$), aluminum s-butoxide ($Al(OC_4H_9)_3$), trimethyl aluminum ($Al(CH_3)_3$, trimethyl ammonia aluminum $Al(CH_3)_3NH_3$, and the like, and suitable combinations of any two or more thereof. Suitable phosphorous precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and suitable combinations of any two or more thereof. Suitable antimony precursors include, for example, stibine ($SbH_3$) and antimony trichloride ($SbCl_3$), which is soluble in alcohol.

Surface Modification and Dispersion Process

The submicron silicon particles generally are dispersed for further processing or use. In some embodiments, the dispersion can be further stabilized by surface modifying the silicon particles. The surface modifying agents of particular interest can form chemical bonds with the particle surface. Through appropriate selection of the dispersing liquid and the particle surface properties, stable dispersions can be formed at reasonable concentrations. The dispersions can be delivered through suitable coating approaches or printed with the dispersion used as an ink. The surface modification process can involve a switch of dispersants.

The surface modification of inorganic particles, e.g., silicon particles, can improve stability of the particle dispersions and provide for dispersion of the particles in a wider range of liquids and potentially at higher concentrations. While some surface modifiers can merely coat the surface, improved stability of the coated particles may be accomplished with surface modifiers that are chemically bonded to the surface. For convenience of terminology, a surface modifying compound refers to a compound that adds at least 3 atoms to the particle surface when it bonds to the particle surface, to distinguish compositions, that modify the surface of a silicon particle or silicon oxide surface coating of the particle such as through the introduction of an Si—OH group or an Si—Cl group. In general, it is expected that the presence of a dopant does not significantly alter the surface modification process or chemistry. A range of surface modifying compounds can be used to chemically bond to the silicon particle surfaces. Suitable functional groups for bonding to inorganic particles with different compositions are described in U.S. Pat. No. 6,599,631 to Kambe et al, entitled "Polymer-Inorganic Particle Composites," incorporated herein by reference.

In particular, alkoxysilanes react with silicon oxides at the surface of silicon particles to form Si—O—Si— bonds to form a stable surface coating with the release of a corresponding compound from the displaced alkoxy silane functional group. For bonding with some surface modification agents, an improved surface coating can be achieved with improved —OH functional group coverage on the surface of the silicon particles.

In particular, trialkoxysilanes provide very stable bonding to oxidized particle surfaces with potentially three points of bonding. The fourth side chain of the trialkoxysilanes provides the ability to influence the dispersability and other surface properties of the surface modified inorganic particles. Specifically, the fourth side chain of the silane can be selected to improve disperability in a selected solvent and/or to provide a reactive functional group for further processing. Similarly, polydialkoxysiloxy silanes provide stable bonding with the ability of each monomer unit to form two bonds to the particle. The siloxane polymer can wrap around the particles during the bonding process. In addition to alkoxy silanes, chemical compounds with other functional groups can form bonds to an oxidized surface of silicon particles. Specifically, compounds with chlorosilicate (—SiCl) groups, some amine groups, carboxylic acid groups and hydroxide groups can also bond to oxidized silicon particle surfaces. Additional functional groups of these compounds can be similarly selected to yield desirable properties for the resulting surface modified particles.

With respect to the alkoxy side chains of silanes, methoxy groups and ethoxy groups have been found to be effective in reacting with inorganic oxide particle surfaces, and a range of compounds with these functional groups are commercially available. Suitable fourth functional groups for the trialkoxy silanes include, for example, alkyl groups, epoxide groups (—$(CH_2)_n CHCH_2 O_{bridge}$), methacryloxyalkyl (—$(CH_2)_n OOC=CH_2$), isocyanate (—$(CH_2)_n NCO$), thiol (—$(CH_2)_n SH$), acetyl (—$(CH_2)_n OOCCH_3$), hydroxybenzophenyl (—$(CH_2)_n OC_6 H_5 (OH)COC_6 H_5$), allyl (—$CH_2 CH=CH_2$), and phenethyl (—$(CH_2)_n C_6 H_5$). In general, the surface modifying compound can be coated at a coverage from less than a monolayer to four or more monolayers as well as values between. The amount of coverage can be estimated based on the surface area of the particles and the amount of compound that can be expected to pack along the particle surface.

Other surface modification approaches for silicon particles are described above. In particular, oxidized silicon particle surfaces can be reacted to form hydrogenated surfaces, and the resulting Si—H groups can be functionalized with organic compounds. In other embodiments, un-oxidized silicon particle surfaces can be reacted with $Cl_2$ to form Si—Cl bonds that are susceptable to nucleophilic substitution to provide desired functionalization of the silicon particle surface.

One of at least two processes can be used to perform the surface modification. In one approach, an unstable, higher concentration dispersion can be formed with the silicon particles, and the surface modification is performed to stabilize the higher concentration dispersion. However, better particle dispersions generally are obtained through first forming a dilute, relatively stabile dispersion of the particles without surface modification and then performing the surface modification.

In the direct approach, the liquid is selected to balance the dispersion of the unmodified particles, the solubility of the surface modifying compound unbound to the particles and the dispersion of the particles following surface modification. Generally, the liquid is not a particularly good dispersant for the unmodified particles. Similarly, the liquid may not be a good solvent for the surface modifying agent. But if the surface modifying agent is somewhat soluble in the liquid and the unmodified particles can be dispersed with mixing, the surface modification reaction can be performed. As the particles become surface modified, the dispersion may stabilize as the reaction proceeds.

Better dispersion results generally can be obtained if the inorganic particles without a surface modifier are first stably dispersed with a desirably small average secondary particle size. Alcohols and water/alcohol blends generally are good dispersants for silicon particles with surface oxidation. The surface modifying compound can be added directly into the dispersing liquid if it has some solubility, or the surface modification compound can be dissolved into a solvent that is miscible with or soluble in the liquid of the particle dispersion. After the surface modification is complete, the particles can be transferred to a different dispersing liquid as described below. The surface modified particles can be stored or shipped in a liquid suitable for further processing.

In general, to change dispersing liquids, it has been found effective to settle the particles by forming a liquid mixture in which the stability of the dispersion is lost. Centrifugation or filtration can be used to efficiently separate the particles from the liquid once they are no longer stably dispersed. If the particles are centrifuged, the liquid is decanted from the precipitated particles. The particles can be washed one or more times with a selected dispersing liquid to remove residual amounts of the original liquid. Then, the particles can be redispersed in the selected liquid. In this way, the liquid can be changed for a later processing step through the selection of a surface modifier that facilitates dispersion in the selected liquid.

Following surface modification and/or at other stages of the dispersion process, the dispersion can be filtered to remove contaminants and or any stray unusually large particles. Generally, the filter is selected to exclude particulates that are much larger than the average secondary particle size so that the filtration process can be performed in a reasonable way. In general, the filtration processes have not been suitable for overall improvement of the dispersion quality. Suitable commercial filters are available, and can be selected based on the dispersion qualities and volumes.

Properties and Formation of the Dispersions and Inks

The dispersions can be formulated for a selected application. The dispersions can be characterized with respect to composition as well as the characterization of the particles within the dispersions. In general, the term ink is used to describe a dispersion that is subsequently deposited using a printing technique, and an ink may or may not include additional additives to modify the ink properties.

The dispersions comprise a liquid and the dispersed silicon particles, which may or may not be surface modified. In general, silicon particles formed by laser pyrolysis can be well dispersed in a polar organic liquid at moderate concentrations with no surface modification, although higher concentration dispersions generally can be formed with surface modification. Suitable alcohols include, for example, small aliphatic alcohols, such as methanol, ethanol, propylene glycol, butanediol, mixtures thereof and the like. Upon surface modification, the silicon particles can be dispersed in a broader range of solvents and solvent blends through the matching of the chemical properties of the surface modifying agent with the liquid. Thus, following surface modification, the particles can be well dispersed in a range of less polar solvents, such as ethyl lactate, n-methylpyrrolidinone, gamma-butyl lactone and the like.

Better dispersions are more stable and/or have a smaller secondary particle size indicating less agglomeration. As used herein, stable dispersions have no settling without mixing after one hour. In some embodiments, the dispersions exhibit no settling of particles without mixing after one day and in further embodiments after one week, and in additional embodiments after one month. In general, dispersions with well dispersed particles can be formed at concentrations of at least up to 30 weight percent inorganic particles. Generally, for some embodiments it is desirable to have dispersions with a particle concentration of at least about 0.05 weight percent, in other embodiments at least about 0.25 weight percent, in additional embodiments from about 0.5 weight percent to about 30 weight percent and in further embodiments from about 1 weight percent to about 20 weight percent. A person of ordinary skill in the art will recognize that additional ranges of stability times and concentrations within the explicit ranges above are contemplated and are within the present disclosure.

The dispersions can include additional compositions besides the silicon particles and the dispersing liquid or liquid blend to modify the properties of the dispersion to facilitate the particular application. For example, property modifiers can be added to the dispersion to facilitate the deposition process. Surfactants can be effectively added to the dispersion to influence the properties of the dispersion.

In general, cationic, anionic, zwitter-ionic and nonionic surfactants can be helpful in particular applications. In some applications, the surfactant further stabilizes the particle dispersions. For these applications, the selection of the surfactant can be influenced by the particular dispersing liquid as well as the properties of the particle surfaces. In general, surfactants are known in the art. Furthermore, the surfactants can be selected to influence the wetting or beading of the dispersion/ink onto the substrate surface following deposition of the dispersion. In some applications, it may be desirable for the dispersion to wet the surface, while in other applications it may be desirable for the dispersion to bead on the surface. The surface tension on the particular surface is influenced by the surfactant. Also, blends of surfactants can be helpful to combine the desired features of different surfactants, such as improve the dispersion stability and obtaining desired wetting properties following deposition. In some embodiments, the dispersions can have surfactant concentrations from about 0.01 to about 5 weight percent, and in further embodiments from about 0.02 to about 3 weight percent.

The use of non-ionic surfactants in printer inks is described further in U.S. Pat. No. 6,821,329 to Choy, entitled "Ink Compositions and Methods of Ink-Jet Printing on Hydrophobic Media," incorporated herein by reference. Suitable non-ionic surfactants described in this reference include, for example, organo-silicone surfactants, such as SILWET™ surfactants from Crompton Corp., polyethylene oxides, alkyl polyethylene oxides, other polyethylene oxide derivatives, some of which are sold under the trade names, TERGITOL™, BRIJ™, TRITON™, PLURONIC™, PLURAFAC™, IGEPALE™, and SULFYNOL™ from commercial manufacturers Union Carbide Corp., ICI Group, Rhone-Poulenc Co., Rhom & Haas Co., BASF Group and Air Products Inc. Other nonionic surfactants include MACKAM™ octylamine chloroacetic adducts from McIntyre Group and FLUORAD™ fluorosurfactants from 3M. The use of cationic surfactants and anionic surfactants for printing inks is described in U.S. Pat. No. 6,793,724 to Satoh et al., entitled "Ink for Ink-Jet Recording and Color Ink Set," incorporated herein by reference. This patent describes examples of anionic surfactants such as polyoxyethylene alkyl ether sulfate salt and polyoxyalkyl ether phosphate salt, and examples of cationic surfactants, such as quaternary ammonium salts.

Viscosity modifiers can be added to alter the viscosity of the dispersions. Suitable viscosity modifiers include, for example soluble polymers, such as polyacrylic acid, polyvinyl pyrrolidone and polyvinyl alcohol. Other potential additives include, for example, pH adjusting agents, antioxidants, UV absorbers, antiseptic agents and the like. These additional additives are generally present in amounts of no more than about 5 weight percent. A person of ordinary skill in the art will recognize that additional ranges of surfactant and additive concentrations within the explicit ranges herein are contemplated and are within the present disclosure.

For electronic applications, it can be desirability to remove organic components to the ink prior to or during certain processing steps such that the product materials are effectively free from carbon. In general, organic liquids can be evaporated to remove them from the deposited material. However, surfactants, surface modifying agents and other property modifiers may not be removable through evaporation, although they can be removed through heating at moderate temperature in an oxygen atmosphere to combust the organic materials.

The use and removal of surfactants for forming metal oxide powders is U.S. Pat. No. 6,752,979 to Talbot et al., entitled "Production of Metal Oxide Particles with Nano-Sized Grains," incorporated herein by reference. The '979 patent teaches suitable non-ionic surfactants, cationic surfactants, anionic surfactants and zwitter-ionic surfactants. The removal of the surfactants involves heating of the surfactants to moderate temperatures, such as to 200° C. in an oxygen atmosphere to combust the surfactant. Other organic additives generally can be combusted for removal analogously with the surfactants. If the substrate surface is sensitive to oxidation during the combustion process, a reducing step can be used following the combustion to return the surface to its original state.

In general, if processed appropriately, for dispersions with well dispersed particles, the average secondary particle size can be no more than a factor of four times the average primary particle size, in further embodiments no more than about 3 times the average primary particle size and in additional embodiments no more than about 2 times the average primary particle size. In some embodiments, the volume-average particle size is no more than about 1 micron, in further embodiments no more than about 250 nm, in additional embodiments no more than about 100 nm, in other embodiments no more than about 75 nm and in some embodiments from about 5 nm to about 50 nm. With respect to the particle size distribution, in some embodiment, essentially all of the secondary particles can have a size no more than 5 times the volume-average secondary particle size, in further embodiments no more than about 4 times the volume-average particle size and in other embodiments no more than about 3 times the average particle size. Furthermore, the DLS particle size distribution by volume can have in some embodiments a full width at half-height of no more than about 50 percent of the volume-average particle size. Also, the secondary particles can have a distribution in sizes such that at least about 95 percent of the particles have a diameter greater than about 40 percent of the average particle size and less than about 250 percent of the average particle size. In further embodiments, the secondary particles can have a distribution of particle sizes such that at least about 95 percent of the particles have a particle size greater than about 60 percent of the average particle size and less than about 200 percent of the average particle size. A person of ordinary skill in the art will recognize that additional ranges of particle sizes and distributions within the explicit ranges above are contemplated and are within the present disclosure.

The Z-average particle sizes can be measured using dynamic light scattering. The Z-average particle size is based on a scattering intensity weighted distribution as a function of particle size. Evaluation of this distribution is prescribed in ISO International Standard 13321, Methods for Determination of Particle Size Distribution Part 8: Photon Correlation Spectroscopy, 1996. The Z-average distributions are based on a single exponential fit to time correlation functions. However, small particles scatter light with less intensity relative to their volume contribution to the dispersion. The intensity weighted distribution can be converted to a volume-weighted distribution that is perhaps more conceptually relevant for evaluating the properties of a dispersion. For nanoscale particles, the volume-based distribution can be evaluated from the intensity distribution using Mie Theory. The volume-average particle size can be evaluated from the volume-based particle size distribution. Further description of the manipulation of the secondary particle size distributions can be found in Malvern Instruments—DLS Technical Note MRK656-01, incorporated herein by reference.

The viscosity of the dispersion/ink is dependent on the silicon particle concentration as well as the other additives. Thus, there are several parameters that provide for adjustment of the viscosity. The viscosity is particularly relevant for inkjet printing although other printing and coating processes may have desired viscosity ranges. For some embodiments, the viscosity can be from 0.1 mPa·s to about 100 mPa·s and in further embodiments from about 0.5 mPa·s to about 25 mPa·s. For some embodiments, the dispersions/inks can have a surface tension from about 2.0 to about 6.0 N/m$^2$ and in further embodiments from about 2.2 to about 5.0 N/m$^2$ and in additional embodiments form about 2.5 to about 4.5 N/m$^2$. A person of ordinary skill in the art will recognize that additional ranges of viscosity and surface tension within the explicit ranges above are contemplated and are within the present disclosure.

The dispersions/inks can be formed using the application of appropriate mixing conditions. For example, mixers/blenders that apply shear can be used and/or sonication can be used to mix the dispersions. The particular additives can be added in an appropriate order to maintain the stability of the particle dispersion. In general, appropriately selected surfactants and some property modifiers can stabilize the particle dispersion. A person of ordinary skill in the art can select the additives and mixing conditions empirically based on the teachings herein.

Printing and Other Deposition Approaches

The dispersions/inks can be deposited for using a selected approach that achieves a desired distribution of the dispersion on a substrate. For example, coating and printing techniques can be used to apply the ink to a surface. Using selected printing approaches, patterns can be formed with high resolution. Following deposition, the deposited material can be further processed into a desired device or state.

Suitable coating approaches for the application of the dispersions include, for example, spin coatings, dip coating, spray coating, knife-edge coating, extrusion or the like. Coating approaches generally are used to cover a substrate, although a mask or the like can be used to limit the deposition locations following removal of the mask. In general, any suitable coating thickness can be applied, although in embodiments of particular interest, coating thickness can range from about 50 nm to about 500 microns and in further embodiments from about 100 nm to about 250 microns. A person of ordinary skill in the art will recognize that additional ranges of thicknesses within the particular ranges above are contemplated and are within the present disclosure.

Similarly, a range of printing techniques can be used to print the dispersion/ink into a pattern on a substrate. Suitable printing techniques include, for example, screen printing, inkjet printing, lithographic printing, gravure printing and the like. Suitable substrates include, for example, polymers, such as polysiloxanes, polyamides, polyimides, polyethylenes, polycarbonates, polyesters, combinations thereof, and the like, ceramic substrates, such as silica glass, and semiconductor substrates, such as silicon or germanium substrates. The composition of the substrates influences the appropriate range of processing options following deposition of the dispersion/ink.

While various coating and printing approaches are suitable, inkjet printing offers desirable features with respect to speed, resolution and versatility with respect to real time selection of deposition patterning while maintaining speed and resolution. Practical deposition using inkjet printing with inorganic particles requires dispersion properties that involve both the techniques to form high quality silicon nanoparticle along with the improved ability to form high quality dispersions from these particles. Thus, the particles produced using laser pyrolysis combined with the improved surface modification approaches and dispersion techniques provides for the formation of inks that are amenable to inkjet deposition.

In general, following deposition, the liquid evaporates to leave the particles and any other non-volatile components of the inks remaining. If the substrate tolerates suitable temperatures and if the additives have been properly selected, the additives can be removed through the addition of heat in an appropriate oxygen atmosphere to remove the additives, as described above. Similarly, with suitable substrates, the silicon particles can then be melted to form a cohesive mass of the silicon deposited at the selected locations. If the heat treatment is performed with reasonable control over the conditions, the deposited mass does not migrate significantly from the deposition location, and the fused mass can be further processed into a desired device.

Solar Cell and Other Semiconductor Applications

For solar cell and other semiconductor applications, silicon particles can be used to form doped contacts that can form a portion of a particular device. A representative printed substrate is shown in FIG. 1. In this embodiment, substrate 100 has a surface coating 102 with windows 104, 106 through coating 102 to expose a portion of the substrate surface. Silicon ink is printed to form deposits 108, 110 on the substrate surface. The substrate comprises silicon, germanium or an alloy thereof. Suitable substrates include, for example, high purity silicon wafers and the like. In other embodiments, suitable substrates include silicon/germanium foils, as described in copending U.S. patent application Ser. No. 11/717,605 filed on Mar. 13, 2007 to Hieslmair et al., entitled "Thin Silicon or Germanium Sheets and Photovoltaics Formed From Thin Sheets," incorporated herein by reference. A silicon dispersion/ink can be applied over the surface using the coating or printing techniques described above.

Some specific embodiments of photovoltaic cells using thin semiconductor foils and back surface contact processing is described further in U.S. Provisional patent application Ser. No. 60/902,006 filed on Feb. 16, 2007 to Hieslmair, entitled "Photovoltaic Cell Structures, Solar Panels, and Corresponding Processes," incorporated herein by reference. In some embodiments, the silicon ink is applied through pre-established windows to the substrate surface. The doped ink is printed within the substrate windows. Other patterning or no patterning can be used as desired for a particular application.

To form a device component from the silicon particle deposit, the material is heated. For example, the structure can be placed into an oven or the like with the temperature set to soften the particles such that fuse into a mass. The time and temperature can be adjusted to yield a desired fusing and corresponding electrical properties of the fused mass. Alternative approaches can be used to heat the surface of the substrate with the deposit. A thermal process based on taking advantage of reduced melting temperatures for silicon nanoparticles with a particle size no more than roughly 10 nm is described in U.S. Pat. No. 5,576,248 to Goldstein, entitled "Group IV Semiconductor Thin Films Formed at Low Temperature Using Nanocrystal Precursors," incorporated herein by reference. This reference describes films that are no thicker than about 20 nm. Higher temperatures or light based fusing can be used to achieve thicker deposits.

However, improved control of the resulting doped substrate as well as energy saving can be obtained through the use of light to melt the silicon particles without generally heating the substrate or only heating the substrate to lower temperatures. Local high temperatures on the order of 1400° C. can be reached to melt the surface layer of the substrate as well as the silicon particles on the substrate. Generally, any intense source selected for absorption by the particles can be used, although excimer lasers or other lasers are a convenient UV source for this purpose. Eximer lasers can be pulsed at 10 to 300 nanoseconds at high fluence to briefly melt a thin layer, such as 20 nm to 1000 nm, of the substrate. Longer wavelength light sources such as 1 micron wavelength light sources can also be used.

Thermal and light based fusing of silicon particles is described further in published U.S. Patent Application 2005/0145163A to Matsuki et al., entitled "Composition for Forming Silicon Film and Method for Forming Silicon Film," incorporated herein by reference. In particular, this reference describes the alternative use of irradiation with a laser or with a flash lamp. Suitable lasers include, for example, a YAG laser or an excimer laser. Noble gas based flash lamps are also described. The heating generally can be performed in a non-oxidizing atmosphere.

Following the fusing of the silicon particles into a solid structure, additional processing steps can be performed to incorporate the resulting structure into the device. For photovoltaic applications, the fused deposit can comprise a doped silicon material that forms a p-doped or n-doped contact. The contacts are then connected to appropriate current collectors to provide for harvesting of the power from the photovoltaic cell.

Integrated Circuit Applications

The ability to print appropriate silicon inks provides for the formation of circuit components at moderate resolution and high efficiency. The printing process can effectively be used to form large area structures. If the particles can be fused at appropriately low temperatures, the deposits can be formed on polymer substrates. In these embodiments, the powders can be used to form flexible electronics.

In particular, the silicon inks can be used to form one or more structures within a display, which can be a flexible display and which can have a small area or a large area. For example, Aveso, Inc. is marketing smart credit cards with small printed displays. This technology is described further, for example, in published PCT Application WO 2006/0227523A to Pennaz et al., entitled "Layered Structure With Printed Elements," incorporated herein by reference.

Thin film transistors (TFTs) can be used to gate new display structures including, for example, active matrix liquid crystal displays, electrophoretic displays, and organic light emitting diode displays (OLED). Appropriate elements of the transistors can be printed using conventional photolithographic approaches or for moderate resolution using inkjet printing or other suitable printing techniques. The substrates can be selected to be compatible with the processing temperatures for the ink.

The TFTs comprise doped semiconductor elements and corresponding interfaces. Thin film transistors used as electronic gates for a range of active matrix displays are described further in Published U.S. Patent Application number 2003/0222315A to Amundson et al., entitled "Backplanes for Display Applications, and Components for use Therein," incorporated herein by reference. An n-type doped polycrystalline or amorphous silicon TFT active element with an anode common structure with an organic LED element is described further in U.S. Pat. No. 6,727,645 to Tsjimura et al., entitled "Organic LED Device," incorporated herein by reference. OLED display structures are described further, for example, in published U.S. Patent Application 2003/0190763 to Cok et al., entitled "Method of Manufacturing a Top-Emitting OLED Display Device With Desiccant Structures," incorporated herein by reference. Conventional photolithography techniques for the formation of TFTs is described further in U.S. Pat. No. 6,759,711 to Powell, entitled "Method of Manufacturing a Transistor," incorporated herein by reference. These conventional photolithography approaches can be replaced with the printing approaches described herein. U.S.

Pat. No. 6,759,711 further describes integration of TFTs with an active matrix liquid crystal display. The silicon nanoparticle inks described herein can be effectively used to print elements of a TFT with selected dopants.

Biochips are growing in use for diagnostic medical purposes. U.S. Pat. No. 6,761,816 to Blackburn et al., entitled "Printed Circuit Boards With Monolayers and Capture Ligands," incorporated herein by reference. These biochip arrays have electrical circuits integrated with biological components so that automatic evaluations can be performed. The functional inks described herein can be used to form electrical components for these devices while biological liquids can be printed or otherwise deposited for the other components.

Radio-Frequency Identification (RFID) tags are gaining widespread use for loss prevention. These devices are desired to be small for less obtrusiveness and low cost. The silicon inks described herein can be used effectively to print RFIDs or components thereof. Systems for printing RFIDs on a roll-to-roll configuration are described further in published U.S. Patent Application serial number 2006/0267776A to Taki et al., entitled "RFID-Tag Fabricating Apparatus and Cartridge," incorporated herein by reference.

In coating deposition approaches, the silicon ink deposition and fusing of the particles can be used as a relatively direct replacement for CVD process with the potential of having lower cost and less capital expenditure since high vacuum equipment is not needed. Also, liquid coating and printing processes can be performed on large substrates that are difficult to handle with CVD equipment.

For inkjet printing applications, the use of materials is significantly reduced due to deposition only where the material is needed. Inkjet printing with existing equipment can achieve the moderate resolution that is presently needed for many applications. As inkjet technology improves further, the resolution of the printing process can be improved further. Inkjet printing can be effectively used for very large substrates. For processing approaches with appropriately low temperature cures, the printing can be performed onto a range of flexible substrates.

EXAMPLES

Example 1

Dispersion of Silicon Particles in Alcohols

This example demonstrates that silicon particles generated using laser pyrolysis can be well dispersed in alcohols.

Figure 8:
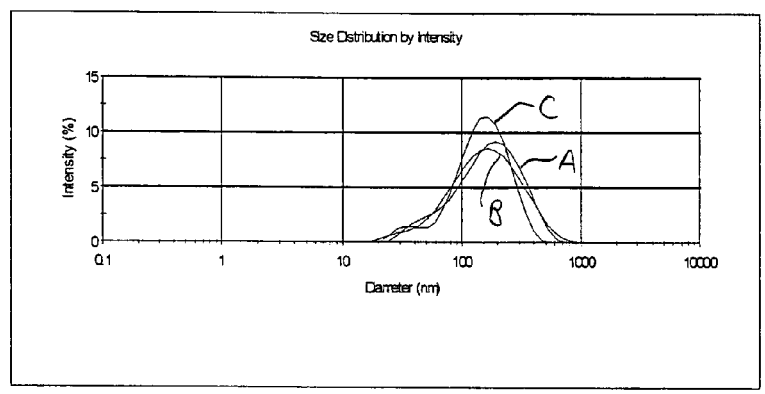
FIG. 8 is a plot of the particle size distribution by DLS of a silicon particle dispersion for nanoscale silicon particles with or without a surface modification in methanol at 0.5 weight percent.

The silicon particles were synthesized using laser pyrolysis with an apparatus essentially as shown in FIG. 8 of U.S. provisional patent application Ser. No. 60/961,429 to Holunga et al. filed Jul. 20, 2007, entitled "Laser Pyrolysis with In-Flight Particle Manipulation for Powder Engineering," incorporated herein by reference. Inert quenching gas was introduced into the system to cool the product particles. The particles were synthesized using silane as the precursor and argon as an inert moderating gas. The silane decomposes under intense laser light to form the silicon. The powders used in this example had a BET surface area of 69.9 $m^2/g$.

Figure 2:
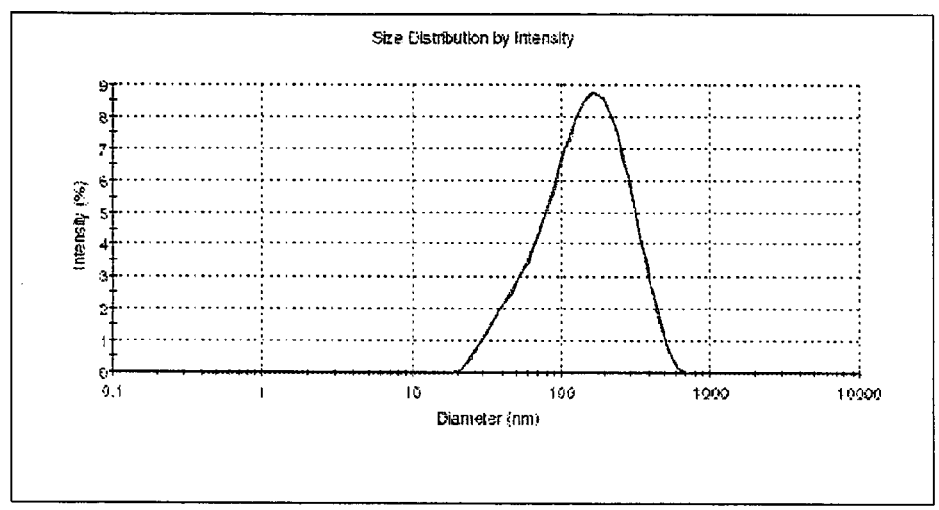
FIG. 2 is a plot of particle size distribution by dynamic light scattering (DLS) of a silicon particle dispersion for nanoscale silicon particles in methanol at 0.5 weight percent.
Figure 3:
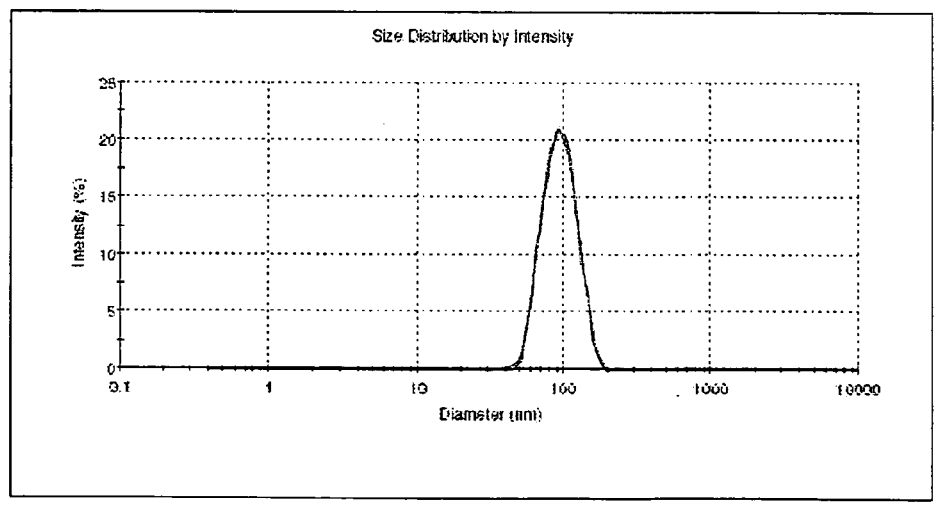
FIG. 3 is a plot of particle size distribution by DLS of a silicon particle dispersion for nanoscale silicon particles in propylene glycol at 0.5 weight percent.

A 0.3 portion of the silicon powder was blended with 60 grams of alcohol to form a 0.5 weight percent dispersion. The particle size distributions were obtained with dynamic light scattering (DLS) using a Malvern ZetaSizer™ instrument. The results for methanol dispersing liquid are plotted in FIG. 2, and the results for propylene glycol are plotted in FIG. 3. The dispersion in propylene glycol had a smaller Z-average particle size, 91.8 nm versus 114.9, and a narrower particle size distribution. The dispersions were stable for at least a month.

Example 2

Dispersions of Surface Modified Silicon Particles

This example demonstrates that surface modified silicon particles can be dispersed at higher concentrations with reasonable stability and transferred between liquids.

The silicon particles were synthesized using laser pyrolysis as described above with respect to Example 1. These powders for this example had a BET surface area of 77 $m^2/g$. Initially, 500 mg of the unmodified particles were mixed with 50 g of gamma butylrolactone liquid, and the mixture was sonicated for 1 h with an ultrasonic probe sonicator.

Figure 4:
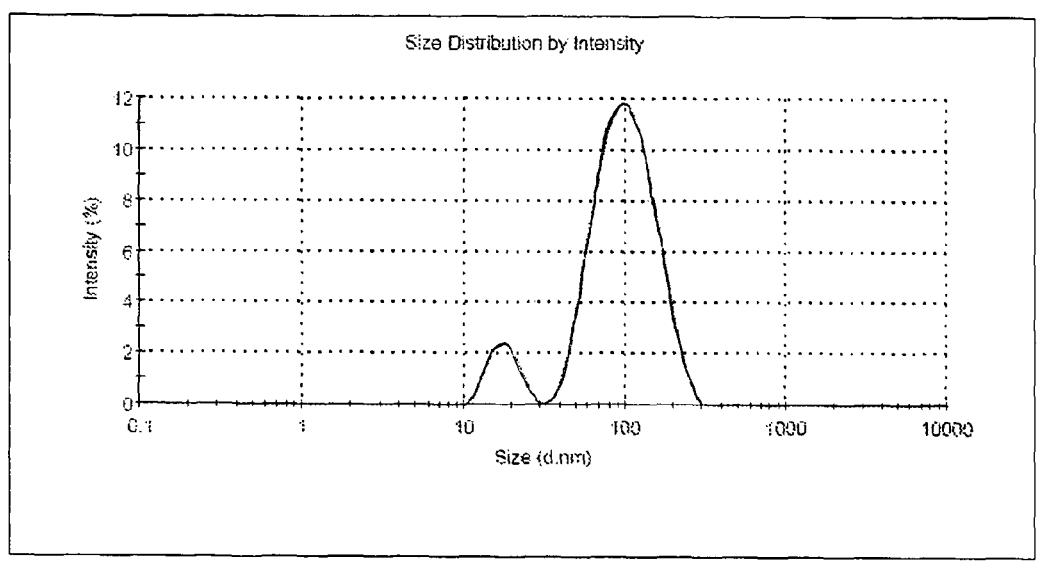
FIG. 4 is a plot of particle size distribution by DLS of a silicon particle dispersion for nanoscale silicon particles with a surface modification in gamma butylactone at 1.0 weight percent.

Then, 155 mg of methacryloxypropyl trimethoxysilane (Z6030, Dow Corning.) was added to the dispersion, and the sample was placed in an ultrasonic bath for 4.5 hr. The size distribution of the resulting 1 weight percent dispersion was measured by DLS, and the lot of the particle size distribution is shown in FIG. 4. The distribution had a Z-average particle size of 72.0 nm with two peaks, with a smaller peak at 17.9 nm and a larger peak at 108 nm.

Figure 5:
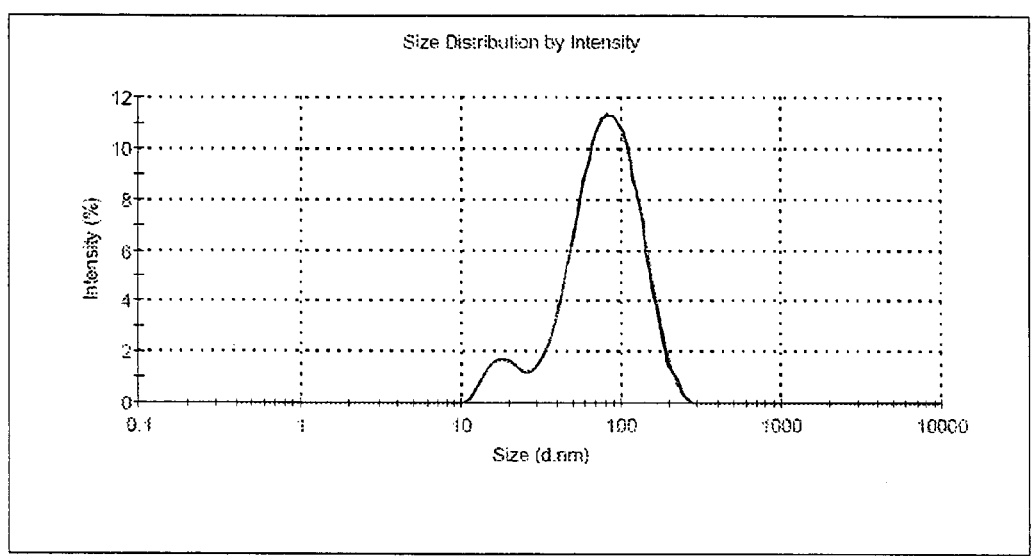
FIG. 5 is a plot of the particle size distribution by DLS of a silicon particle dispersion for nanoscale silicon particles with a surface modification in ethyl lactate at 1.0 weight percent.

A 30 ml aliquot of the dispersion in gamma butylactone was mixed with 60 ml of hexane and 60 ml of acetone to destabilize the dispersion. The sample was then centrifuged at 5000 rpm for 60 minutes. The supernatant was discarded, and the precipitate was redispersed in ethyl lactate using 20 minutes in an ultrasonic bath. Ethyl lactate dispersions at 15, 10 and 5 weight percent seemed to be stable. Due to the darkness of the dispersions, the properties of the dense dispersions could not be evaluated in any detail. No settling could be observed, and after weeks there were no visible changes to the dispersions suggesting that the dispersion were stable for at least several weeks. These concentrations were not amenable to DLS particle size distribution measurements due to the high optical density. DLS measurements at 1 weight percent are presented in FIG. 5. The particle size distribution had a Z-average particle size of 62.6 nm and also had two peaks, with one at 18.3 nm and a larger peak at 86.2 nm.

Example 3

Surface Modification of Silicon Particles in Ethyl Acetate

In this example, the particles are directly surface modified in ethyl lactate at two different concentrations.

Figure 6:
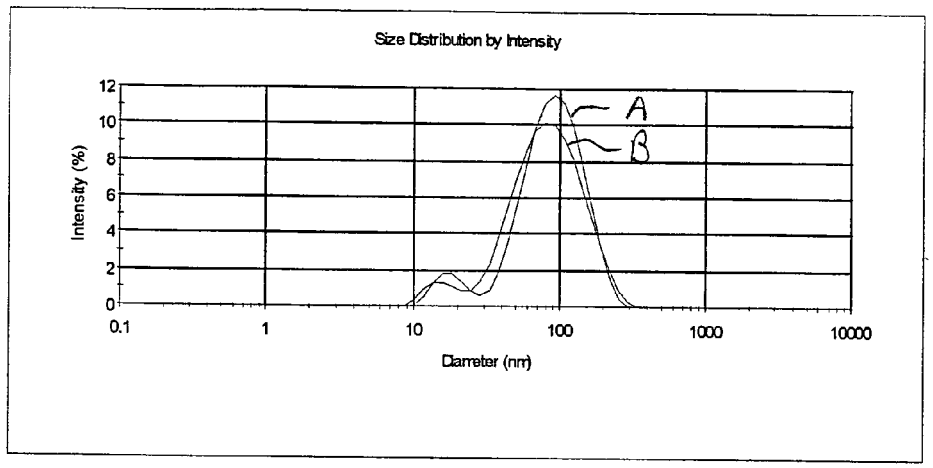
FIG. 6 is a plot of the particle size distribution by DLS of a silicon particle dispersion for nanoscale silicon particles with and without surface modification in ethyl lactate at 1.0 weight percent.

A 500 mg quantity of silicon particles (surface area 74 $m^2/g$ as measured by BET) were mixed with 50 g of ethyl lactate and sonicated in a bath sonicator for 2 hrs to form a 1 weight percent dispersion. Then, 143 mg of methacryloxypropyltrimethyloxysilane surface modification agent was added, and the resulting dispersion was sonicated for another 2 hours. The intensity-based particles size distributions obtained by DLS both before (A) and after (B) surface modification are shown in FIG. 6. After surface modification, the intensity average particle size distribution is smaller than before surface modification.

Figure 7:
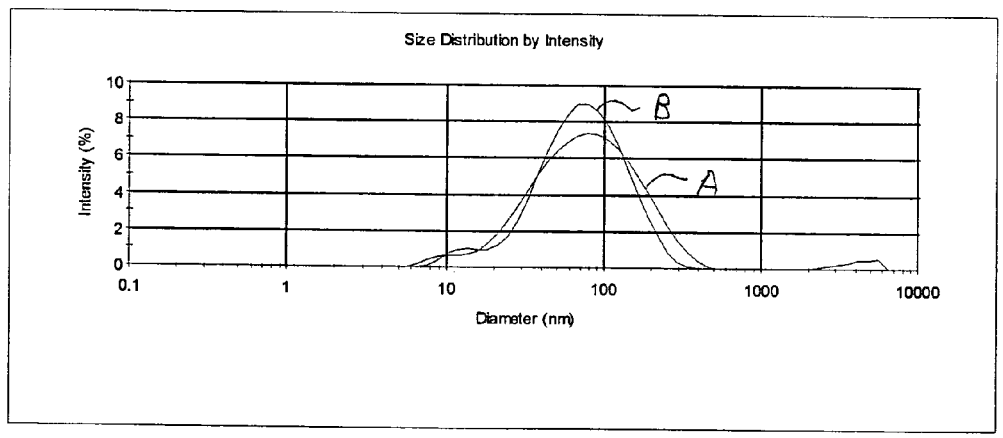
FIG. 7 is a plot of the particle size distribution by DLS of a silicon particle dispersion for nanoscale silicon particles with a surface modification in ethyl lactate formed at 5 weight percent concentration and diluted to 1.0 weight percent for the DSL measurement.

A 1 g quantity of silicon particles (surface area 69 $m^2/g$ as measured by BET) were mixed with 20 g of ethyl lactate and sonicated in a bath sonicator for 2 hrs to form a 5 weight percent mixture. Then, 275 mg of methacryloxypropyltrimethyloxysilane surface modification agent was added, and the resulting mixture was sonicated for another 2 hours. The high optical density of the sample prohibited acquisition of DLS data at such a high concentration. Visual inspection of the samples after sitting overnight revealed that fewer particles settled at the bottom of the sample bottles for the surface modified samples relative to samples that did not involve surface modification. To obtain DLS measurements, the samples were diluted to 1 weight percent. The intensity-based particles size distributions obtained by DLS for the diluted sample both without surface modification (A) and with surface modification (B) are shown in FIG. 7.

Example 4

Comparison of Surface Modification in Methanol and Gamma Butyrolactone

This example compares the resulting particle size distributions for samples surface modified in methanol versus gamma butyrolactone.

In sample 1, 150 mg of silicon particles (surface area 68 m²/g as measured by BET) were mixed with 30 g of methanol to form a 0.5 weight percent dispersion. The sample was then bath sonicated for 2 hrs. A 40 mg quantity of methacryloxypropyl trimethoxysilane silane surface modification agent was added, and the sample was sonicated for another 4 hrs. The intensity-based particle size distribution measured by DLS at 0.5 wt % concentration is shown in FIG. 8 before surface modification (A) and after surface modification (B).

In sample 2, 1 g of silicon particles (surface area 68 m2/g as measured by BET) were mixed with 20 g of methanol to form a 5 weight percent dispersion. The sample was then bath sonicated for 2 hrs. A 275 mg quantity of methacryloxypropyltrimethoxysilane was added, and the sample was sonicated for another 4 hrs. A 100 g quantity of hexane was added to destabilize the dispersion, and the sample was centrifuged at 4000 rpm for 20 min. The precipitate was redispersed in 200 g of methanol via bath sonication for 20 min. The intensity-based particle size distribution measured by DLS at 0.5% concentration is shown also in FIG. 8 (C).

Figure 9:
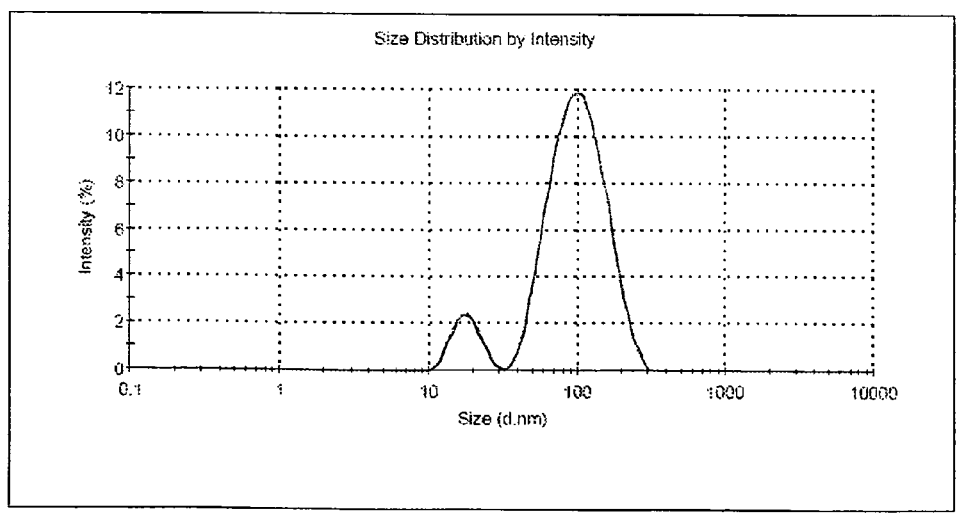
FIG. 9 is a plot of the particle size distribution by DLS of a silicon particle dispersion for nanoscale silicon particles without surface modification in gamma butylrolactone at 1.0 weight percent.
Figure 10:
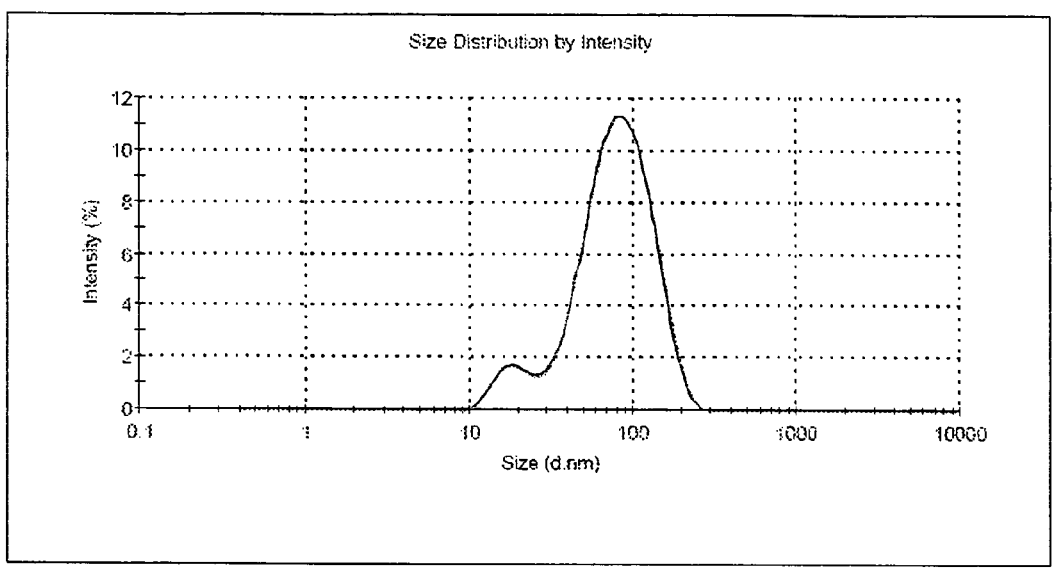
FIG. 10 is a plot of the particle size distribution by DLS of a silicon particle dispersion for nanoscale silicon particles with a surface modification in ethyl lactate at 1.0 weight percent following performance of the surface modification in gamma-butylrolactone.

In another sample, a 500 mg quantity of silicon particles (surface area of 77 m²/g as measured by BET) were mixed with 50 g of gamma butyrolactone to form a 1 weight percent dispersion and sonicated with an ultrasonic probe sonicator (Hielscher, model UP200S) for 1 h at 60% amplitude and 0.5 cycle. Then, a 155 mg quantity of methacryloxypropyltrimethoxysilane silane was added to the dispersion, and the sample was place in an ultrasonic bath for 4.5 h at 65 DEG C. The intensity-based particle size distribution measured by DLS is shown in FIG. 9. A 30 mL aliquot of the dispersion in gamma butyrolactone was mixed with 60 mL of hexanes and 60 mL of acetone to destabilize the dispersion. The sample was centrifuged at 5000 RPM for 60 min. The supernatant was discarded, and the precipitate was redispersed in ethyl lactate by a 20 minutes sonication in an ultrasonic bath. Dispersions at 15, 10, and 5 wt % appeared mostly stable for over a day, but the high optical density of the sample prohibited acquisition of DSL data at such high concentrations. The intensity-based DLS particle size distribution at 1% concentration in ethyl lactate is plotted in FIG. 10.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A dispersion of silicon/germanium nanoparticles comprising a polar organic liquid and at least about 0.1 weight percent silicon/germanium nanoparticles, wherein the silicon/germanium nanoparticles have an average primary particle diameter of no more than about 100 nm, and a volume-average secondary particle diameter of no more than about 250 nm and a hydrogenated surface with Si/Ge—H bonds, wherein the silicon/germanium nanoparticles comprise a dopant selected from the group consisting of B, Al, Ga, P, As, Sb, and combinations thereof, and wherein the dispersion has no settling without mixing after one hour.

2. The dispersion of claim 1 wherein the silicon/germanium nanoparticles have a distribution of secondary particle sizes such that at least about 95 percent of the secondary particles have a particle size greater than about 40 percent of the average diameter and less than about 250 percent of the average particle size.

3. The dispersion of claim 1 wherein the silicon/germanium particles in the dispersion have a dynamic light scattering particle size distribution by volume with a full width at half-height of no more than about 50 percent of the volume-average particle size.

4. The dispersion of claim 1 wherein effectively no secondary particle sizes are greater than about five times the volume-average secondary particle size as determined by dynamic light scattering measurements.

5. The dispersion of claim 1 wherein the dispersion comprises at least about 5 weight percent silicon/germanium particles.

6. The dispersion of claim 1 wherein the nanoparticles have a surface modification moiety chemically bonded to the surface of nanoparticles.

7. The dispersion of claim 1 wherein the liquid comprises an organic liquid.

8. The dispersion of claim 1 wherein the silicon/germanium nanoparticles comprise silicon nanoparticles having a dopant concentration of at least about $1.0 \times 10^{-7}$ atomic percent relative to the silicon.

9. A method for depositing silicon nanoparticles, the method comprising printing an ink comprising the dispersion of claim 1 wherein the ink has a viscosity of no more than about 400 mPa·s at room temperature.

10. The method of claim 9 wherein the printing is performed with an inkjet printer.

11. The method of claim 9 wherein the ink has a viscosity of no more than about 300 mPa·s at room temperature.

12. The method of claim 9 wherein the ink has a concentration of at least about 2 weight percent silicon/germanium particles and wherein the silicon/germanium particles have a surface modification moiety chemically bonded to their surface.

13. The method of claim 12 wherein the surface modification moiety is formed through the reaction of a surface modification compound with the particle, the surface modification compound comprising an alkoxysilane.

14. The method of claim 9 wherein the ink comprises a viscosity modifying organic composition and an organic surfactant.

15. The method of claim 9 wherein the ink has a surface tension from about 2.0 N/m² to about 6.0 N/m².

16. The dispersion of claim 1 having a particle concentration from about 1 weight percent to about 20 weight percent.

17. The dispersion of claim 1 wherein the average primary particle diameter is no more than about 50 nm.

18. The dispersion of claim 1 wherein the average primary particle diameter is from about 2 nm to about 35 nm.

19. The dispersion of claim 1 wherein the liquid comprises an alcohol.

20. The dispersion of claim 1 wherein the silicon/germanium nanoparticles have a dopant concentration from about 0.1 atomic percent to about 10 atomic percent.

* * * * *